United States Patent [19]

Lynch

[11] Patent Number: 4,900,269

[45] Date of Patent: Feb. 13, 1990

[54] CONNECTOR HOUSING

[75] Inventor: Thomas M. Lynch, Williamsport, Pa.

[73] Assignee: GTE Products Corporation, Stamford, Conn.

[21] Appl. No.: 290,656

[22] Filed: Dec. 27, 1988

[51] Int. Cl.[4] ........................ H01R 13/58; H05K 7/12

[52] U.S. Cl. ........................ 439/499

[58] Field of Search ........................ 439/67, 77, 59, 329, 439/492, 493, 499, 495, 590

[56] References Cited

U.S. PATENT DOCUMENTS

| | | | |
|---|---|---|---|
| 3,088,090 | 4/1963 | Cole et al. | 439/495 |
| 3,848,946 | 11/1974 | Halley et al. | 439/495 |
| 4,406,511 | 9/1983 | Hayes | 439/499 X |
| 4,477,137 | 10/1984 | Ayer | 439/590 |

FOREIGN PATENT DOCUMENTS

| | | | |
|---|---|---|---|
| 2844346 | 4/1979 | Fed. Rep. of Germany | 439/77 |

*Primary Examiner*—William Briggs

*Attorney, Agent, or Firm*—William H. McNeill

[57] ABSTRACT

A connector housing for use with a flex board having openings therethrough completely surrounded by the flex board surface. The housing includes a top portion which pivots to open and closed positions relative to a bottom portion. Ribs extend from the bottom portion for flex board alignment and ribs extend from the top portion which interdigitate with the bottom ribs and cause the conductors on the flex board to be electrically coupled to respective contacts of the connector housing.

19 Claims, 2 Drawing Sheets

CONNECTOR HOUSING

BACKGROUND OF THE INVENTION

1. Field of the Invention

The present invention relates to a mechanical interconnect between flex print and a connector housing.

2. Description of the Prior Art

Connector housings are used to effect a mechanical interconnect with a flexible printed circuit terminal, flex print, flat ribbon cable, and the like which are typically in the form of a flat flexible substrate having a plurality of conductors extending along one or both surfaces thereof. Such a conductor is generally referred to herein as a flex board. Examples of connectors for use with a flex board are described in the following U.S. patents:

| | |
|---|---|
| 3,245,024 | Evans |
| 4,358,173 | Conrad |
| 4,468,074 | Gordon |
| 4,509,811 | Amano et al |
| 4,630,874 | Renn et al |
| 4,634,195 | Shoemaker |
| 4,639,063 | Mueller |
| 4,640,562 | Shoemaker |
| 4,647,131 | Van Woensel |
| 4,695,108 | Ichitsubo |
| 4,695,258 | Hanson et al |

There have been limitations incurred in the use of mechanical connectors with flex boards particularly those with very small distances between the conductors on the flex board surface. For example, it is known that mechanical interconnects for use with flex boards having .030 inch centers cause damage to the flex board due to its fragile nature. It is desirable to provide an improved mechanical-type connector. It is also desirable to provide a mechanical connector for use with a flex board which protects the flex board from damage. To this end it is desirable to provide a connector housing which includes a protective nest-like structure which aligns the conductors, maintains spacing as desired, and prevents shorts. It is also desirable to provide a connector housing which provides the necessary individual contact pressure for making the interconnect. It is further desirable to provide a connector housing which allows the flex board to fall into place with ease when assembling the flex board into the housing.

SUMMARY OF THE INVENTION

The invention achieves these and other results by providing a connector housing for electrically coupling to a flex board having a plurality of spaced openings extending therethrough, each opening being completely surrounded by the flex board. The flex board further includes a respective conductor of a plurality of conductors on at least one side of the flex board and positioned between respective spaced openings of the plurality of spaced openings. The connector housing comprises a top portion including a plurality of spaced first ribs extending therefrom and a bottom portion removably coupled to the top portion and including a plurality of spaced second ribs extending therefrom. The first ribs of the plurality of first ribs are interleaved with the second ribs of the plurality of second ribs when the top portion is coupled to the bottom portion. A plurality of contacts is provided, individual of the contacts being positioned between respective second ribs of the plurality of spaced second ribs and having a contact area extending towards a respective first rib of the plurality of spaced first ribs. Means associated with the top portion and the bottom portion is provided for removably coupling the top portion to the bottom portion so that when the flex board is inserted between the top portion and the bottom portion a respective second rib of the plurality of spaced second ribs can extend through a respective spaced opening of the plurality of spaced openings, and a respective conductor of the plurality of conductors can be urged into electrical contact with a respective contact of the plurality of contacts by a respective first rib of the plurality of spaced first ribs.

DESCRIPTION OF THE PREFERRED EMBODIMENT

Figure 1:
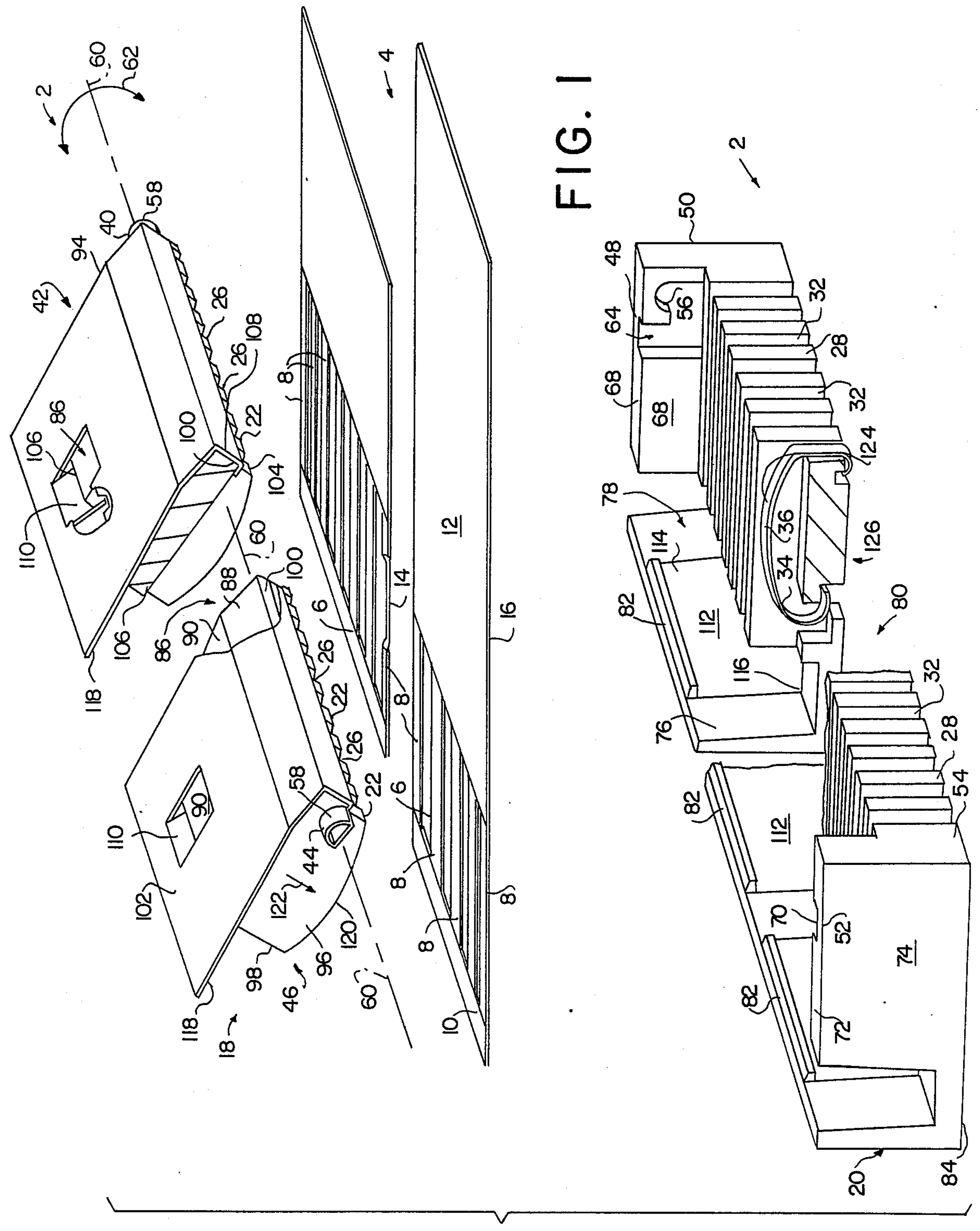
FIG. 1 is an exploded elevational view partially sectioned of the connector housing of the present invention in an open position; and, FIG. 2 is an elevational view partially sectioned, of the connected housing of the present invention in a closed position.
Figure 2:
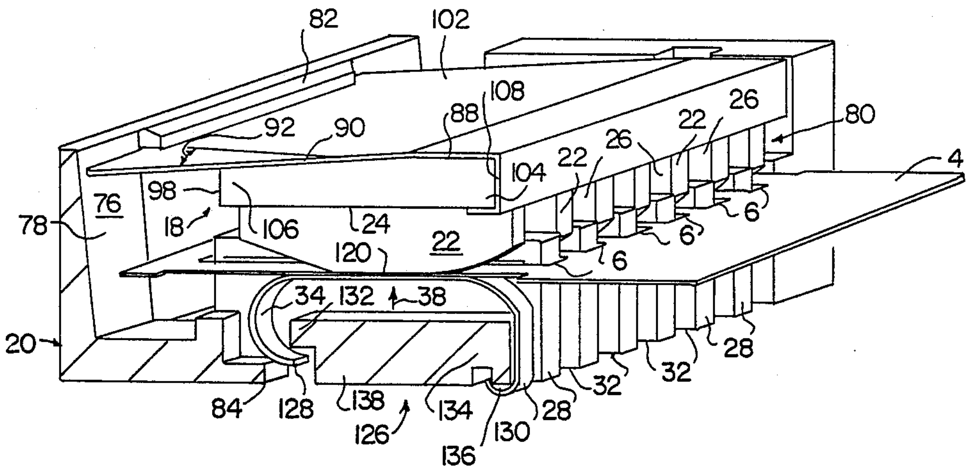

The embodiment which is illustrated in FIGS. 1 and 2 is particularly suited for achieving the objects of this invention. FIGS. 1 and 2 depict a connector housing 2 for electrically coupling to a flex print or flex board 4. Flex board 4 includes a plurality of spaced openings 6 extending through the board. Each opening 6 is completely surrounded by the flex board. In other words, each opening 6 is surrounded by portions 8, 10 and 12 of the flex board 4. The flex board 4 includes a plurality of conductors 14 on at least one side 16 of the board. Respective conductors 14 are positioned between respective spaced openings 6 on side 16 at portions 8 and extend further along the length of the board in a known manner.

With the exception of the openings 6 which are completely surrounded by respective surface areas of the flex board 4 for use as described hereinafter, the flex board is similar to those known in the art for insertion into a connector opening in a known manner. In the embodiment depicted in FIGS. 1 and 2, a connector housing 2 is provided having a top portion 18 and a bottom portion 20. Top portion 18 includes a plurality of spaced first ribs which extend from the top portion. In particular, top portion 18 includes a plurality of first ribs 22 extending from the underside 24 of the top portion and having spaces 26 therebetween. Bottom portion 20 is removably coupled to top portion 18 as described below. The bottom portion 20 includes a plurality of spaced second ribs which extend from the bottom portion. In particular, bottom portion 20 includes a plurality of second ribs 28 extending upwardly and having spaces 32 therebetween. The ribs 22 are interleaved with the ribs 28 as depicted in FIG. 2 when the top portion 18 is coupled to the bottom portion 20.

A plurality of contacts 34 is also provided. Each contact 34 is positioned between repsective ribs 28 at respective spaces 32, only one such contact 34 being depicted in the drawings. Each contact 34 includes a contact area 36 which extends in the direction of arrow 38 towards a repsective rib 22 as best seen in FIG. 2.

Means associated with the top portion 18 and bottom portion 20 is also provided for removably coupling the top portion to the bottom portion so that when the flex board 4 is inserted between the top portion and bottom portion, each second rib 28 can extend through a respective opening 6 and each conductor 14 can be urged into electrical contact with a respective contact 34 by a respective first rib 22. For example, in the preferred embodiment top portion 18 is pivotally coupled to bottom portion 20 for pivoting to an open position to insert the flex board 4 between the top and bottom portions of the connector housing, and to a closed position to electrically couple a respective conductor of the plurality of conductors to a respective contact of the plurality of contacts. Such coupling means include a first hinge pin 40 extending from one end 42 of the top portion 18 and a second hinge pin 44 extending from an opposite end 46 of the top portion 18, and a corresponding first bore 48 into which the first hinge pin 40 is insertable at one end 50 of the bottom portion 20 and a corresponding second bore 52 into which the second hinge pin 44 is insertable at an opposite end 54 of the bottom portion 20.

In the preferred embodiment, the first bore 48 includes a first bore surface 56 which can be engaged by the first hinge pin 40, and the second bore 52 includes a corresponding second bore surface 56 (not shown) which can be engaged by the second hinge pin 44. The first and second first bore surfaces 56 are preferably curved as depicted in FIG. 1. The engagement of the first bore surface and the second bore surface by the first hinge pin 40 and second hinge pin 44 respectively provides means for pivoting the top portion 18 relative to the bottom portion 20. In particular, as depicted in FIG. 1, each first and second hinge pin includes a curved surface 58 which can be caused to slide upon the corresponding curved portion of each respective first and second bore surface 56 for pivoting the top portion 18 relative to the bottom portion 20 about axis 60 in the direction of arrow 62. In order to provide access of each hinge pin to a respective first and second bore surface, a first bore access opening 64 is provided extending from an edge 66 of a first side wall 68 to the first bore surface 56 and a second bore access opening 70 is provided extending from an edge 72 of a second side wall 74 to the second bore surface.

In the embodiment of FIGS. 1 and 2, the bottom portion 20 comprises the first side wall 68 having first bore 48 therein, the second side wall 74 having the second bore (not shown) therein, the first bore and second bore facing each other, and a rear wall 76 extending from the first side wall 68 to the second side wall 74. The first side wall 68, second side wall 74, and rear wall 76 form a cavity 78 having an opening 80 opposite rear wall 76. Rear wall 76 includes at least one lip 82 extending therefrom towards the opening 80, and the bottom portion 20 further includes a lower surface 84.

When top portion 18 is pivoted to a closed position relative to the bottom portion 20, as depicted in FIG. 2, the top portion includes an upper surface 86 having a first surface area 88 which is substantially parallel to the lower surface 84 of the bottom portion. Upper surface 86 also includes a second surface area 90 which extends at an angle 92 relative to the first surface area 88. towards the lower surface 84.

In the preferred embodiment, the top portion 18 includes a first side surface 94 which includes the first hinge pin 40 and a second side surface 96 which includes the second hinge pin 44, the first and second hinge pins extending away from each other adjacent the first surface area 88. Top portion 18 also includes a rear surface 98 and a front surface 100 extending from the first side surface 94 and second side surface 96 at a respective front and rear of the top portion. A cover member 102 is provided such that it engages the upper surface 86 of the top portion and extends beyond the top portion at rear surface 98. In this manner the cover member 102 forms a fit with a lip or lips 82 when the top portion is pivoted to a closed position relative to the bottom portion to lock the top portion in place relative to the bottom portion as depicted in FIG. 2.

In the prferred embodiment the top portion 18 includes at least one first flange 104 at the front surface 100 and at least one second flange 106 at the rear surface 98. In such an embodiment, the cover member 102 extends from the first surface area 88 and includes at least one channelled portion 108 which engages the first flange 104 to hold the cover member in place relative to the front surface 100 of the top portion 18. Cover member 102 can also include at least one tab 110 extending therefrom in the region where the cover member extends beyond the top portion. Tab 110 snap-fits with second flange 106 to hold the cover member in place relative to the rear surface 98 of the top portion 18.

The top portion 18 can be pivotally mounted to the bottom portion 20 by inserting the hinge pins 40 and 44 into respective bores 48 and 52. The top portion can then be pivoted to a closed position relative to the bottom portion as the first ribs 22 are interleaved with the second ribs 28 as depicted in FIG. 2. The top portion can be locked in a closed position relative to the bottom portion by providing a cover member 102 which is somewhat flexible so that it forms a snap-fit with the lips 82. In the preferred embodiment, however, the rear wall 76 includes at least one recessed portion adjacent each lip 82. For example, as depicted in FIG. 1, the rear wall 76 includes a recessed portion 112 adjacent each lip 82. Each recessed portion 112 is preferably configured to form an inclined plan extending into the rear wall 76 from a position in the region 114 of lip 82 to a position 16 spaced from lip 82. In such embodiment, the portions 118 of the cover member 102 which extend beyond the top portion at rear surface 98 can be inserted into a respective recessed portion 112 near position 116 and the hinge pins can then be inserted into respective bores by means of respective bore access openings 64 and 70 while simultaneously sliding cover member portions 118 upwards along a respective inclined plane until each cover member portion 118 bears against a respective lip 82.

In the preferred embodiment, each respective first rib 22 includes a surface portion 120 for contacting the flex board 4 between a respective opening 6. Surface portion 120 is curved away from top portion 18 in the direction of arrow 122. In the embodiment depicted in FIGS. 1 and 2 the surface portion 120 forms an irregular curve extending in a direction from the front surface 100 towards the rear surface 98.

In a like manner, preferably each metal contact 34 is resilient and includes a contact surface area 124 for contacting a respective conductor 14, contact surface area 124 being curved away from the bottom portion 20 in the direction of arrow 38.

The bottom portion 20 includes a plurality of generally T-shaped mounting members 126 (only one being shown in each Figure), individual of the T-shaped mounting members 126 being positioned between respective second ribs 28. Corresponding contacts 34 include a first bent end 128 and an opposite second bent end 130 hich are used to attach a respective contact 34 to a respective T-shaped mounting member 126 such that each bent end 128 engages a corresponding arm 132 and bent end 130 engages an opposite corresponding arm 134 of the T-shaped mounting member. Attachment of each contact to a corresponding T-shaped mounting member can be further facilitated by providing each arm 134 with a protrusion 136 which extends away from arm 134 in the general direction of the leg 138 of the T-shaped member. In this manner each contact 34 has a J-lead which can be coupled at protrusion 136 to provide a J-lead surface mount.

The connector housing of the present invention is an improved connector housing which protects the flex board from damage by providing a nest-like structure which aligns the conductors, maintains spacing as desired, and prevents shorts by mating the top portion 18 with the bottom portion 20 such that such portions inter-mesh creating a tongue and groove housing which completely surrounds the individual connector fingers of the flex board. The ribs 22 engage the flex board and urge it towards the bottom portion 20 when the connector housing is in a closed position thereby providing the necessary individual contact pressure for making the interconnect by urging conductors 14 into electrical contact with respective contacts 34. The ribs 28 extend through openings 6 in the flex-board allowing the conductor fingers of the flex board to fall into place when the flex board is inserted into the connector housing when in an open position.

The embodiments which have been described herein are but some of several which utilize this invention and are set forth here by way of illustration but not of limitation. It is apparent that many other embodiments which will be readily apparent to those skilled in the art may be made without departing materially from the spirit and scope of this invention.

I claim:

1. A connector housing for electrically coupling to a flex board having a plurality of spaced openings extending therethrough, each opening being completely surrounded by said flex board, said flex board further having a respective conductor of a plurality of conductors on at least one side of said flex board and positioned between respective spaced openings of said plurality of spaced openings, comprising:

a top portion including a plurality of spaced first ribs extending therefrom;

a bottom portion removably coupled to said top portion and including a plurality of spaced second ribs extending therefrom, said first ribs of said plurality of first ribs being interleaved with said second ribs of said plurality of second ribs when said top portion is coupled to said bottom portion;

a plurality of contacts, individual of said contacts being positioned between respective second ribs of said plurality of spaced second ribs and having a contact area extending towards a respective first rib of said plurality of spaced first ribs; and means associated with said top portion and said bottom portion for removably coupling said top portion to said bottom portion so that when said flex board is inserted between said top portion and said bottom portion a respective second rib of said plurality of spaced second ribs can extend through a respective spaced opening of said plurality of spaced openings, and a respective conductor of said plurality of conductors can be urged into electrical contact with a respective contact of said plurality of contacts by a respective first rib of said plurality of spaced first ribs, and wherein said top portion is pivotally coupled to said bottom portion for pivoting to an open position to insert said flex board between said top portion and said bottom portion and to a closed position to electrically couple a respective conductor of said plurality of conductors to a respective contact of said plurality of contacts, said coupling means including (1) a first hinge pin extending from one end of said top portion and a second hinge pin extending from an opposite end of said top portion, and (2) a corresponding first bore into which said first hinge pin is insertable at one end of said bottom portion and a corresponding second bore into which said second hinge pin is insertable at an opposite end of said bottom portion.

2. The connector housing of claim 1 wherein each respective first rib of said plurality of spaced first ribs includes a surface portion for contacting said flex board between a respective opening of said plurality of spaced openings, said surface portion being curved away from said top portion.

3. The connector housing of claim 2 wherein said bottom portion includes a lower surface, and further wherein when said top portion is pivoted to a closed position relative to said bottom portion said top portion includes an upper surface having a first surface area which is substantially parallel to said lower surface and a second surface area which extends at an angle relative to said first surface area towards said lower surface.

4. The connector housing of claim 3 wherein said bottom portion includes a first side wall including said first bore, a second side wall including said second bore, said first bore and said second bore facing each other, and a rear wall extending from said first side wall to said second side wall, said first side wall, second side wall and rear wall forming a cavity having an opening opposite said rear wall, said rear wall including at least one lip extending therefrom towards said opening, and further wherein said top portion includes a first side surface including said first hinge pin, a second side surface including said second hinge pin, said first and second hinge pins extending away from each other adjacent said first surface area, and a rear surface and a front surface extending from said first side surface to said second side surface at a respective front and rear of said top portion, and wherein said connector housing further includes a cover member engaging said upper surface of said top portion and extending beyond said top portion at said rear surface forming a fit with said at least one lip when said top portion is pivoted to a closed position relative to said bottom portion to lock said top portion in place relative to said bottom portion.

5. The connector housing of claim 4 wherein said rear wall includes at least one recessed portion adjacent said at least one lip.

6. The connector housing of claim 5 wherein said at least one recessed portion forms an inclined surface extending into said rear wall from a position in the region of said at least one lip to a position spaced from said at least one lip.

7. The connector housing of claim 6 wherein said top portion includes at least one first flange at said front surface, and said cover extends from said first surface area and includes at least one channelled surface which engages said at least one first flange.

8. The connector housing of claim 7 wherein said top portion includes at least one second flange at said rear surface and said cover member includes at least one tab extending therefrom, at a position where said cover member extends beyond said top portion, which snap-fits with said at least one second flange.

9. The connector housing of claim 8 wherein said surface portion forms an irregular curve extending in a direction from said front surface towards said rear surfac.

10. The connector housing of claim 9 wherein said first bore includes a first bore surface which can be engaged by said first hinge pin for pivoting said top portion relative to said bottom portion, and a first bore access opening extending from an edge of said first side wall to said first bore surface for providing access of said first hinge pin to said first bore surface, and wherein said second bore includes a second bore surface which can be engaged by said second hinge pin for pivoting said top portion relative to said bottom portion, and a second bore access opening extending from an edge of said second side wall to said second bore surface for providing access of said second hinge pin to said second bore surface.

11. The connector housing of claim 4 wherein said cover member is flexible.

12. The connector housing of claim 5 wherein said surface portion forms an irregualr curve extending in a direction from said front surface towards said rear surface.

13. The connector housing of claim 12 wherein each contact of said plurality of contacts is resilient and includes a contact surface area for contacting a respective conductor of said plurality of conductors, said contact surface area being curved away from said bottom portion.

14. The connector housing of claim 13 further including a plurality of T-shaped mounting members, individual of said T-shaped mounting members being positioned between respective second ribs of said plurality of space second ribs, each contact of said plurality of contacts having respective first and second bent ends and being attached to a respective T-shaped mounting member such that each bend end engages a corresponding arm of said respective T-shaped mounting member.

15. The connector housing of claim 14 wherein at least one arm of each T-shaped mounting member includes a protrusion which extends away from said at least one arm in the general direction of the leg of said T-shaped mounting member.

16. The connector housing of claim 15 wherein said at least one recessed portion forms an inclined surface extending into said rear wall from a position in the region of said at least one lip to a position spaced from said at least one lip.

17. The connector housing of claim 16 wherein said surface portion forms an irregular curve extending in a direction from said front surface towards said rear surface.

18. The connector housing of claim 17 wherein said top portion includes at least one first flange at said front surface and at least one second flange at said rear surface, said cover member extending from said first surface area and including at least one channelled portion which engages said at least one flange, and at least one tab extending from said cover member, at a position where said cover member extends beyond said top portion, which snap-fits with said at least one second flange.

19. The connector housing of claim 18 wherein said first bore includes a first bore surface which can be engaged by said first hinge pin for pivoting said top portion relative to said bottom portion, and a first bore access opening extending from an edge of said first side wall to said first bore surface for providing access of said first hinge pin to said first bore surface, and wherein said second bore includes a second bore surface which can be engaged by said second hinge pin for pivoting said top portion relative to said bottom portion, and a second bore access opening extending from an edge of said second side wall to said second bore surface for providing access of said second hinge pin to said second bore surface.

* * * * *